United States Patent [19]
Clark

[11] 3,936,753
[45] Feb. 3, 1976

[54] DIGITAL AUTOMATIC FREQUENCY CONTROL CIRCUIT

[75] Inventor: Ronald R. Clark, Ocoee, Fla.

[73] Assignee: Martin Marietta Corporation, Orlando, Fla.

[22] Filed: July 12, 1974

[21] Appl. No.: 488,083

[52] U.S. Cl. ............. 325/420; 325/437; 325/470
[51] Int. Cl.² .................................... H04B 1/32
[58] Field of Search ........... 325/437, 420, 469, 470, 325/423

[56] References Cited
UNITED STATES PATENTS

| | | | |
|---|---|---|---|
| 2,951,150 | 8/1960 | Rennenkampf | 325/437 |
| 3,174,105 | 3/1965 | Morgan, Jr. | 325/420 |
| 3,388,331 | 6/1968 | Rawley | 325/470 |

Primary Examiner—George H. Libman
Attorney, Agent, or Firm—Julian C. Renfro, Esquire; Gay Chin, Esquire

[57] ABSTRACT

A digital automatic frequency control circuit for use with a scanning type superheterodyne receiver, such circuit having an input for receiving the output of a related discriminator, and an output for providing an incrementally variable tuning voltage to a related local oscillator. My novel circuit has a search mode and a lock mode, and during the search mode, when the receiver tuning is swept past a pulsed radio signal, the discriminator produces a sequence of voltage output pulses whose polarity for a desired signal will be different from that of the signal's image. My circuit recognizes the polarity relationships of such pulses, and makes use of such information in a highly advantageous manner in order to cause the receiver to enter the lock mode only when the received signal has the correct relationship with the local oscillator, with the image signal thus being ignored. While in the lock mode, this circuit will track the frequency of the incoming radio frequency energy on a pulse-to-pulse basis, automatically compensating for drifts in the frequency of either the incoming energy or the local oscillator. Although the lock mode will be maintained for a brief, preselected period in the event of momentary fades or the like, after such preselected period is over, the search mode is automatically recommenced.

4 Claims, 4 Drawing Figures

DIGITAL AUTOMATIC FREQUENCY CONTROL CIRCUIT

BACKGROUND OF THE INVENTION

The invention is concerned with scanning type superheterodyne receivers, and more particularly to scan-lock systems that utilize automatic frequency control of a local oscillator for receiving pulsed signals.

A scanning radar receiver is a typical example of such receivers. This type of receiver sweeps a selected bandwidth to search for a sequence of received radar pulses whose center frequency is not known precisely, but lies within the swept bandwidth. As the receiver is tuned across such a signal, it should stop its sweep and lock onto the received signal. After lock on, it must track any change in the received frequency which may be due from such sources as drift in the transmitted signal, changes in receiver components, or frequency changes due to doppler shifts.

Other types of systems using this type of receiver are satellite communication links using pulse code modulation, and missile command and control links. When receivers of this type are operated in the microwave region, little if any preselection or tuned circuits are used ahead of the local oscillator (LO). Therefore, the desired intermediate frequency produced by mixing of the local oscillator with an incoming frequency will be generated by a received signal either above or below the LO frequency. The receiver designer normally selects one of the relationships as the correct IF signal and regards the other as the image frequency.

Most receivers in the prior art have used analog circuitry for controlling the LO frequency. Commonly, an electronically tuned local oscillator is utilized as part of an automatic frequency control (AFC) loop in microwave receivers, but the design of proper AFC circuitry has presented certain problems. This circuitry must sweep the LO through its tuning range until a signal is encountered, and then after lock-on to a signal, it must use inputs from an IF operated discriminator in order to generate the tuning voltage for the LO, to maintain the LO in the locked condition.

Typically, for analog type circuitry, a sophisticated integrator is required that has the unfortunate characteristics of being slow to respond to input changes, that tends to drift with time, and requires elaborate sample and hold circuits to handle pulsed inputs. Additionally, and quite importantly, such analog circuits do not inherently provide protection against locking onto the unwanted image frequency.

SUMMARY OF THE INVENTION

In accordance with the present invention, I provide a unique digital AFC circuit that overcomes the problems that accompany the employment of analog techniques. My novel digital AFC circuit will cause the received signal to be automatically tuned to a pulsed RF signal falling within its tuning range, and to then lock into such signal.

After lock-on, the AFC will maintain the receiver tuned to the pulsed signal, updating the tuning control voltage on a pulse-by-pulse basis. Quite significantly, during the sweeping or scanning mode, while searching for a received signal, my digital AFC will cause the receiver to sweep past and thereby ignore an image signal, and respond only to the received signal when it has the correct frequency relationship with the local oscillator.

The digital AFC circuitry in accordance with this invention provides two modes of operation--a search mode and a lock mode. The AFC circuit is used in combination with a voltage tunable local oscillator, a discriminator connected to the output of the receiver IF amplifier and tuned to the IF center frequency, a carrier presence detector, and an oscillator sweep voltage source.

In accordance with the search mode operation, the receiver sweeps past a pulsed RF signal at a low rate relative to the expected RF pulse rate. The discriminator will produce a sequence of voltage output pulses as a signal is approached. This output voltage will reduce to zero as the receiver tunes exactly to the received carrier frequency, and then a second sequence of DC pulses will be produced as the receiver is tuned past the zero point.

Due to the normal action of the discriminator, the pulse output from the discriminator as the receiver sweep approaches the signal will be of one polarity, and after passing the zero voltage output point, the output pulses will then be of the opposite polarity. It is important to note that the polarity relationships; i.e., whether the first sequence of pulses is positive and the second sequence is negative or vice versa, is dependent on whether the LO frequency is above or below the received signal. These relationships are recognized and made use of in accordance with this invention in order to cause the receiver to lock up only on the correct signal, and to ignore its image signal, this being accomplished in a manner explained briefly at this time, and in more detail hereinafter.

At the time a signal appears in the IF amplifier of my receiver, the signal presence detector produces an enabling voltage. This voltage enables certain digital circuits contained in the digital AFC section of my invention to prepare this section for operation. The pulse sequences from the discriminator are then applied to the input of the AFC circuit, where sensing elements determine the polarity relationship of the pulse sequences. If the polarity is incorrect, indicative of reception of the image signal, no lock-on action takes place, and the receiver continues to sweep. However, when the polarity is correct, the oscillator sweep voltage is automatically switched off and the source of LO tuning voltage is then derived by digital operations performed upon the discriminator output, to bring about the lock mode condition.

When the tuning is exact, a received pulse will produce zero output voltage from the discriminator and the LO tuning voltage will remain constant. However, if drift at any point in the system occurs, a positive or negative pulse will appear at the discriminator output. This pulse causes the digital circuit to increase or decrease the tuning voltage by a selected incremental amount, to bring about a retuning of the LO in the required direction. Thus, the tuning is advantageously and rapidly corrected on a pulse-to-pulse basis in accordance with my invention. After a received signal disappears from the IF amplifier output, such as due to a cessation of transmission, for example, the carrier presence detector will, after a short period, reset the digital AFC circuits to cause sweeping of the oscillator to resume, thereby placing the system back into the search mode, so that a search can be conducted for a new RF signal.

It is therefore a primary object of my invention to provide means for controlling the scanning oscillator of a superheterodyne receiver, to cause the receiver to lock onto a desired pulsed radio frequency signal, and to prevent the receiver from locking onto the image frequency of such signal.

It is a further object of my invention to provide a novel automatic frequency control circuit having capability of updating the tuning of the receiver with respect to each received pulse.

It is another object of my invention to provide a highly stable AFC circuit that maintains the local oscillator frequency of the receiver constant between updates of the tuning.

It is still another object of my invention to provide an AFC circuit that is readily adaptable to a wide range of RF signal pulse repetition rates and pulse widths.

These and other objects, features and advantages of my invention will be more apparent from a study of the appended drawings, in which.

DETAILED DESCRIPTION

Figure 1:
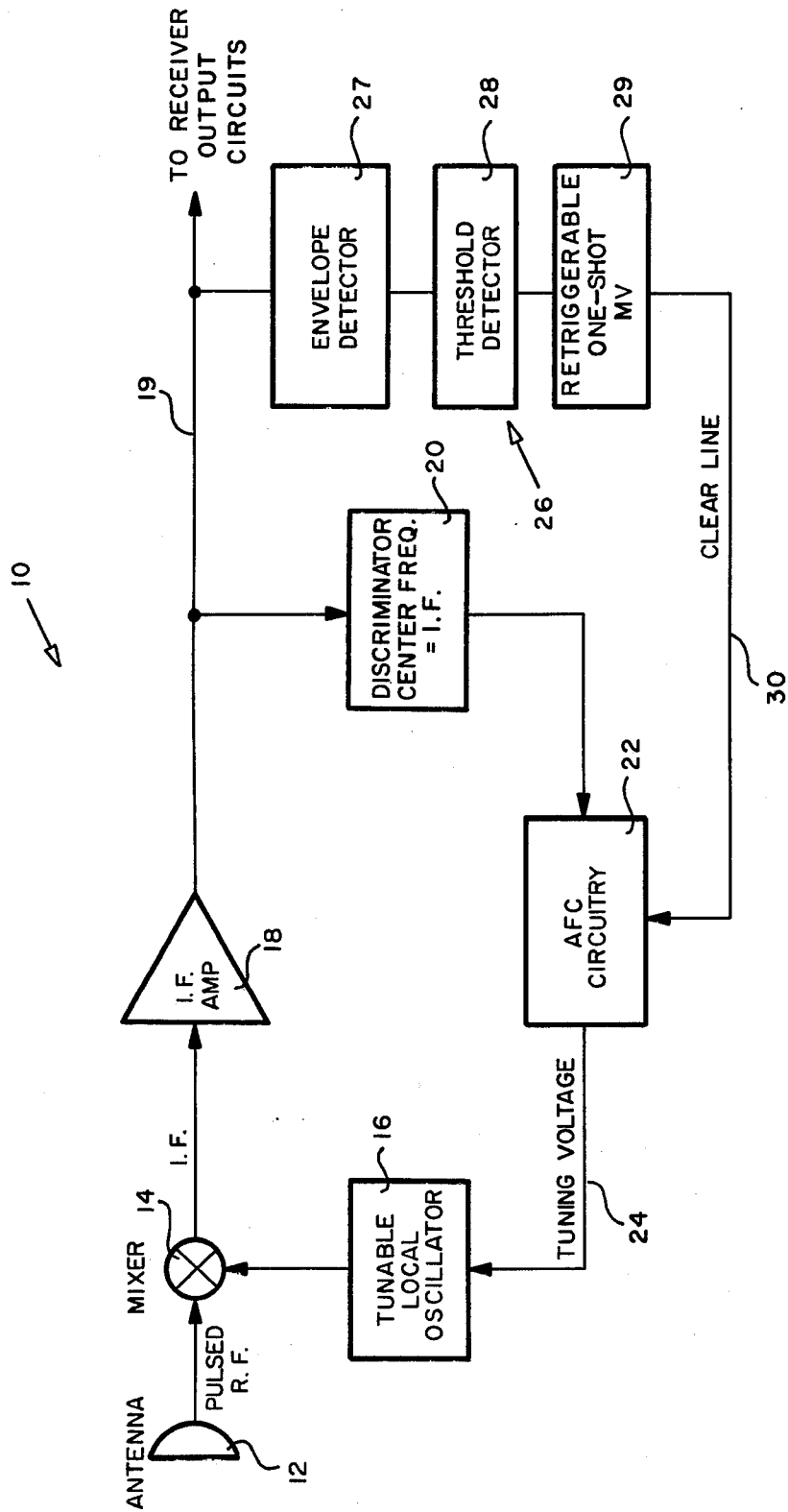
FIG. 1 is an over-all block diagram, revealing a typical organizational setting for my novel AFC circuitry.

Referring to FIG. 1, I have shown a block diagram of a section of a receiver for receiving pulsed radio frequency signals that includes a unique digital automatic frequency control circuit in accordance with my invention. This digital AFC circuit advantageously will cause the receiver to be automatically tuned and locked to the carrier of any pulsed RF signal falling within its tuning range, and will not respond to the image frequency of such carrier.

The automatic frequency control loop 10 comprises mixer 14, intermediate frequency amplifier 18, discriminator 20, automatic frequency control circuit 22, and tunable local oscillator 16. Pulsed RF signals received by antenna 12 are applied to mixer 14. Such signals of proper frequency when mixed with the output of local oscillator 16 produce IF signals falling within the passband of IF amplifier 18. The pulsed RF signals can be either higher in frequency than the frequency of LO 16 or lower in frequency than LO 16, to produce an IF signal falling within such passband of IF amplifier 18. It is required that only one of these conditions be recognized as the correct relationship, and the other condition be considered as the image or undesired difference frequency.

The amplified signals are provided to receiver output circuits on lead 19, and are also directed to discriminator 20. The discriminator may be a conventional double tuned detector for determining when a signal from the IF amplifier is above or below the IF amplifier center frequency. The output of the discriminator 20 is processed by my novel AFC circuitry 22. As will be explained hereinafter, the AFC circuitry 22 has an output, designated Tuning Voltage, that is on lead 24 connected to tunable local oscillator 16 so as to control the frequency thereof in accordance with the signals from discriminator 20, so that the signals will be caused to fall accurately within the passband of IF amplifier 18, and to prevent the tunable local oscillator from tuning to the undesired image frequency condition.

As will be later described in detail, I have provided two modes of operation of AFC loop 10. The initial mode, called the search mode, results in the receiver scanning a broad region of the desired RF band. The final mode, called the lock mode, stops the scanning action and provides "frequency lock" to the desired carrier on a pulse-to-pulse basis after initial lock has been achieved. As seen in FIG. 1, I utilize a "carrier presence" detector 26, comprising envelope detector 27, threshold detector 28, and retriggerable one-shot multivibrator 29. The output from the retriggerable one shot 29 on Clear Line 30 is connected to the AFC circuitry 22 and makes possible a determination when an RF signal is tuned within the IF amplifier 18 passband, and also makes possible the control of certain functions of AFC circuitry 22, as explained hereinafter.

Figure 2:
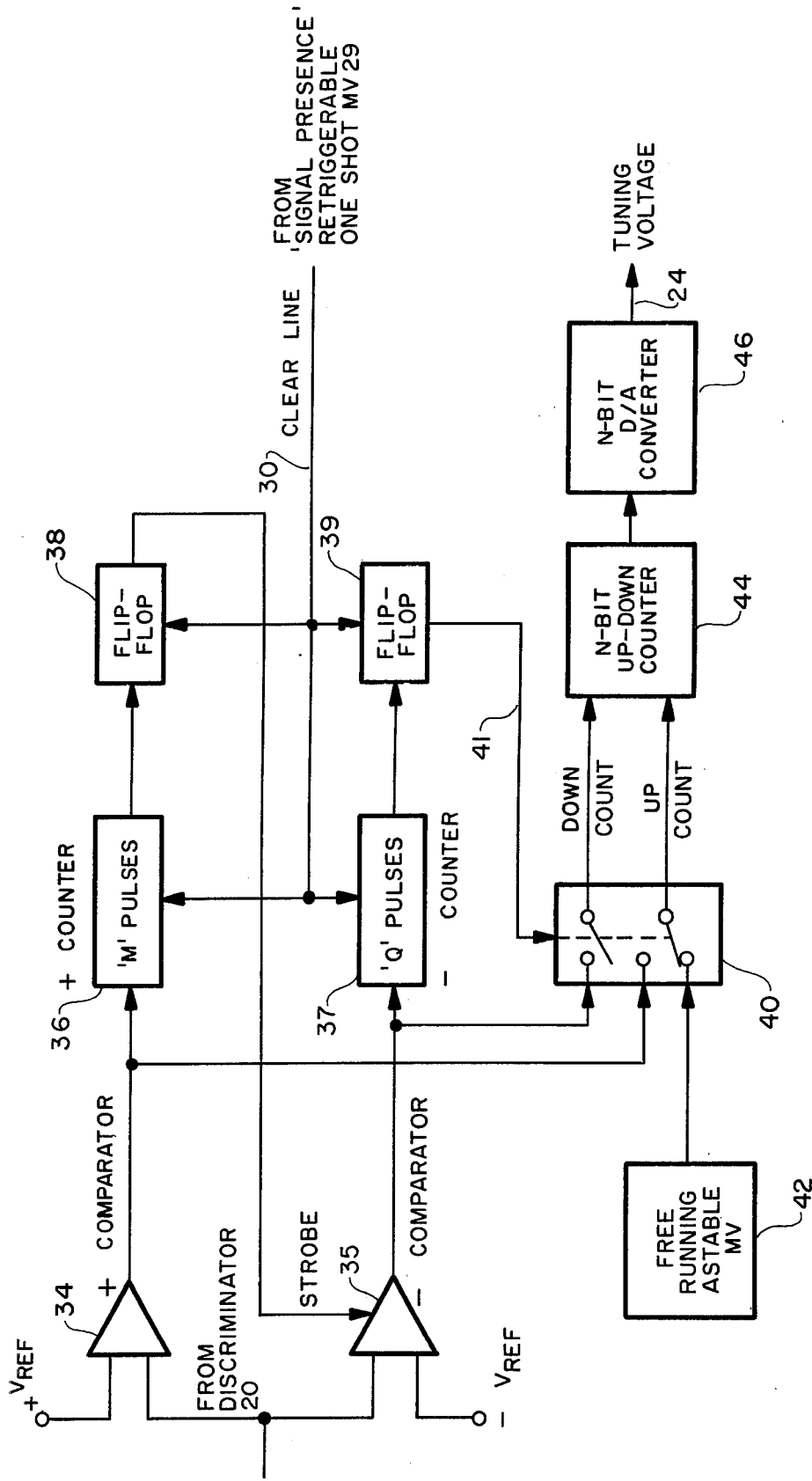
FIG. 2 is a block diagram of a preferred embodiment of my novel digital automatic frequency control circuit.

Turning now to FIG. 2, it will there be seen that I have provided a block diagram of my novel digital AFC circuitry 22. The output from discriminator 20 is connected to input terminals of + comparator 34 and − comparator 35, with each of these comparators also having terminals to which suitable reference voltages, nominally of equal level and opposite polarity, are applied. These comparators serve to prevent false alarms due to the detection of noise, and also serve to establish a fixed amplitude level that will be compatible with the digital circuitry used herein.

It is to be noted at this point that the comparators are responsible for the generation of what may be regarded as a narrow "dead zone" with respect to the discriminator 20 output, which dead zone is centered on the IF center frequency. Outputs from the discriminator that control the AFC circuitry 22 therefore result from signals appearing in two frequency bands, one slightly above the IF center frequency, and the other slightly below this center frequency.

The output of + comparator 34 is directed to the input of + counter 36, and the output of − comparator 35 is directed to the input of − counter 37. The output from counter 36 is connected to flip-flop 38, and the output from counter 37 is connected to flip-flop 39. The counters 36 and 37 as well as the flip-flops 38 and 39 can all be reset at appropriate times by a signal placed upon Clear Line 30.

While I have shown comparator 34 to be responsive to positive voltages, and comparator 35 to be responsive to negative voltages, it should be noted that these polarities could be reversed if it is desired to operate the LO 16 on the opposite side (frequency-wise) of the carrier signal.

Figure 4:
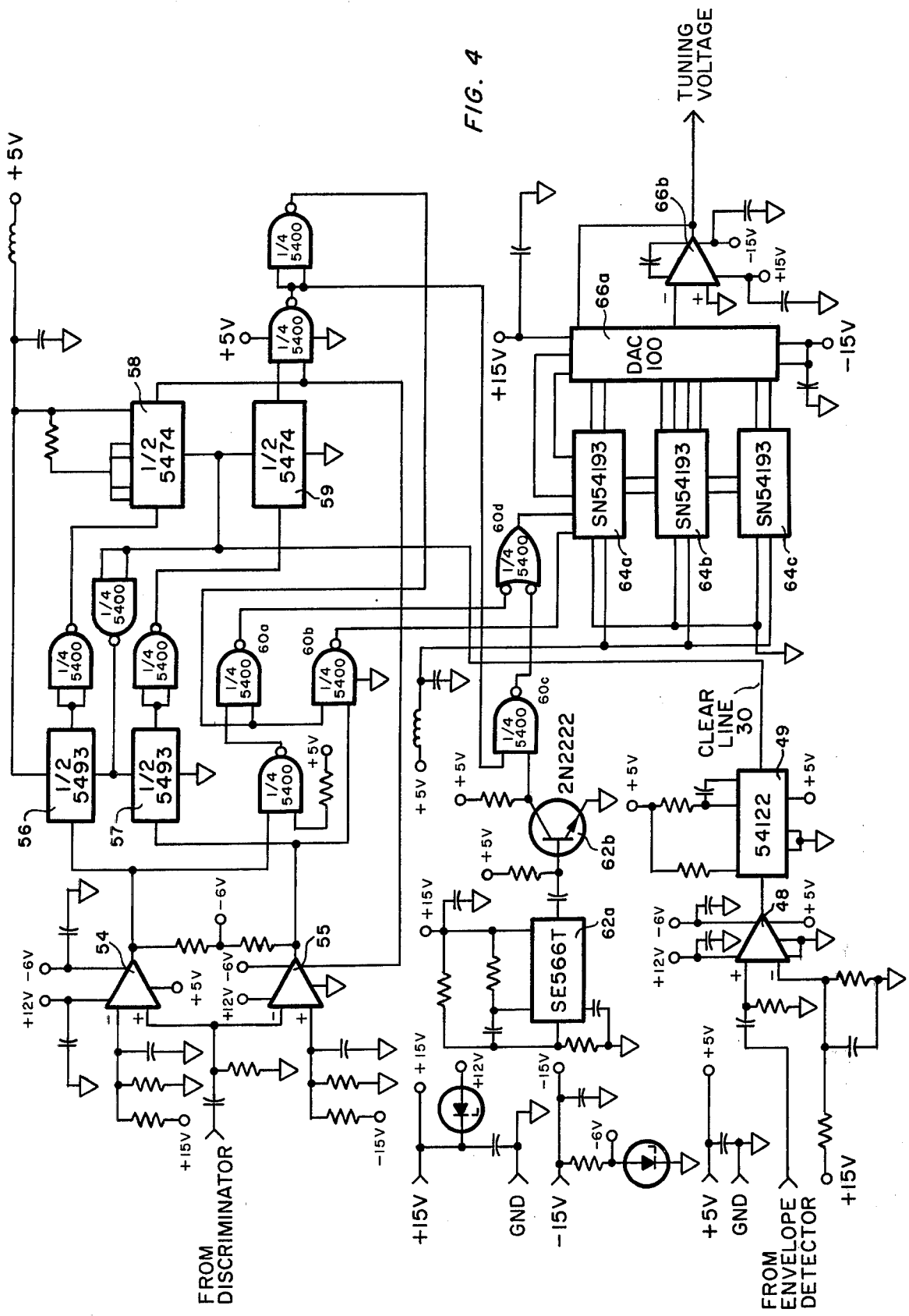
FIG. 4 is a schematic of an exemplary embodiment of my invention.

Outputs from comparators 34 and 35 are also directed to appropriate terminals of a digital switch 40, illustrated as a mechanical device, but which in practice is an electronic switch that may be constituted by four digital gates 60a, 60b, 60c and 60d, as illustrated in FIG. 4. This switch has two positions, one position defining a search mode and the other position defining a lock mode. During the search or normal mode, the switch 40 is connected in the manner illustrated in FIG. 2 in order to connect free running astable multivibrator 42 to N-Bit Up-down counter 44. Counter 44 is in turn connected to drive N-Bit D/A converter 46, which is arranged to produce a Tuning Voltage on lead 24 that serves to cause the local oscillator 16 to be swept through its tuning range; note FIG. 1. This tuning voltage is a ramp with a rapid retrace, the period of the ramp being equal to $2^N \times T$, where T is the period of the astable 42. N is selected from minimum expected pulse repetition frequency and IF bandwith considerations. In the embodiment revealed in FIG. 4, N = 10 and T = 1 ms, which implies a total ramp period of approximately 1 second. As should be obvious, I select N to match the desired IF and loop bandwidths of the receiver.

The + comparator 34 is arranged to drive counter 36 in response to each positive going input pulse from discriminator 20 that exceeds the reference voltage threshold. This threshold may be selected to prevent false outputs due to noise and to define the dead zone of the discriminator. Similarly, − comparator 35 is arranged to drive negative counter 37 in response to each negative going pulse from discriminator 20 that exceeds the reference voltage threshold. However, it is important to note that the comparator 35 remains deactivated until a predetermined number (M) of positive pulses have been counted. The number of such pulses is selected by the design of counter 36. For example, counter 36 may be arranged to count say eight pulses. When this has taken place, flip flop 38 is set, which releases the strobe on the − comparator 35, allowing it to be then triggered by negative-going pulses received from the discriminator.

After the second predetermined number of pulses (Q) have been counted by the negative counter 37, flip-flop 39 is set, which causes the digital switch 40 to be automatically moved to its lock-mode position, disconnecting the astable multivibrator 42 from the up-down counter 44, and simultaneously connecting the outputs of the comparators 34 and 35 to the counter 44. At this time, counter 44 will remain at its last count state, and the Tuning Voltage on line 24 will remain constant at the analog voltage corresponding to such count. The counter 44 and D/A converter 46 can thus be considered as a memory circuit, to hold the voltage level that is present at the output line 24 at the time of switching from the search mode to lock mode.

It is now to be seen that the up-down counter 44 will count up whenever positive-going pulses occur at the output of discriminator 20, and will count down whenever negative-going pulses occur. The D/A converter 46 converts such counts to either increase or decrease the Tuning Voltage on line 24. The increase or decrease in tuning voltage will retune LO 16 to center the signal in the IF band, thus returning the output of discriminator 20 to the desired zero output condition. The tuning voltage in the lock-mode is therefore to be seen to be a function of the state of discriminator 20, and serves to maintain the average discriminator voltage output at zero.

Control of digital switch 40 is brought about by flip-flop 39, with interconnection 41 being provided so that such control may be accomplished. For example, counter 37 may be set for two pulses. Therefore the − comparator 35 drives the − counter 37 until the two pulses have been counted, at which time flip-flop 39 is set. This in turn activates the digital switch 40, which, as previously mentioned, is now caused to function and connect the comparator 34 and 35 to the up-down counter 44, while at the same time disconnecting astable MV 42 from the counter. At this point, control of the up-down counter 44 and hence the tuning voltage output is purely a function of the state of the discriminator 20, as stated above. This is to say, if the input signal frequency received by the antenna changes, the discriminator output will go positive or negative, depending on the direction of the change, and cause the counter and tuning voltage to follow the source. Therefore, subsequent to lock-on, each RF pulse is evaluated and the tuning voltage properly undated essentially immediately. The voltage change due to one pulse is of course dependent on the sensitivity of the D/A converter 46, and is equal to its voltage range divided by $2^N$ volts.

With the foregoing principles of my invention in mind, I will now describe a typical operational sequence of my invention. For example, assume an initial condition of no-signal present, in which instance the tuning voltage on lead 24 will be varying due to the ramp voltage output from D/A converter 46 of the AGC circuit, as previously described. The tunable LO 16 (FIG. 1) will be sweeping across the desired RF tuning range. For correct operation of the AGC circuitry 22 when a pulse sequence appears at the discriminator 20 output, it is necessary that counters 36 and 37 be in their zero-count condition, and that flip-flops 38 and 39 be in their cleared condition. Advantageously, I accomplish this in accordance with my invention by means of carrier presence detector 26 shown in FIG. 1, involving envelope-detector 27, threshold detector 28, and a retriggerable one-shot MV-29. As a signal appears within the passband of IF amplifier 18, a detected pulsed output will be produced by envelope detector 27. When this output is greater than the selected threshold of threshold detector 28, the retriggerable one-shot MV 29 is triggered, which causes the enable command to be placed on Clear Line 30.

Referring again to FIG. 2, the carrier presence signal on Clear Line 30 enables counters 36 and 37, allowing them to receive inputs from comparators 34 and 35, respectively. Also, this carrier presence signal enables flip-flops 38 and 39, so that they may be set by counters 36 and 37 after the appropriate counts have been achieved.

Retriggerable one shot MV 29 is also used to prevent switching the system from the lock mode back to the search mode as a consequence of brief fades, or other short losses of signal. In accordance with my invention, I may establish the pulse length of retriggerable one-shot MV 29 at any value which is consistent with the minimum expected pulse repetition frequency of the source, or it may be of longer duration to accommodate periods of loss of signal from the source due to fading or other reasons. It is important to note that, upon loss of a signal from the source, up-down counter 44, D/A converter 46, and hence the tuning voltage on line 24 remain unchanged until MV 29 has "timed out." For example, if MV 29 has a pulse length of one second, then the Tuning Voltage on line 24, and therefore the frequency of the local oscillator 16, will remain unchanged for one second after the last pulse exceeded the threshold level of comparator 34 or 35. If another pulse is received before the one second time limit, MV 29 is retriggered and therefore cannot "time out" for another second.

When MV 29 does "time out," indicating a loss of signal from the source, the A.F.C. loop returns to the search mode automatically as follows: the polarity of the output of MV 29 is such that when it changes state at "time out," counters 36 and 37 and flip-flops 38 and 39 are held in their clear state. When flip-flop 39 is cleared, digital switch 40 is returned to the search mode, thus returning the involved circuits to the search mode state.

As should now be obvious, when an RF signal of the desired sideband frequency is present within the tuning range of the local oscillator 16, while the receiver is in the search mode, the circuit will then lock the loop as follows: As the LO approaches the signal, an IF pulse train will appear at the output of the IF amplifier 18. This pulse is detected by envelope detector 27 and used to activate retriggerable one-shot MV 29, which enables counters 36 and 37, and flip-flops 38 and 39. Positive pulses will appear at the output of the discriminator 20, and will trigger the + comparator 34. Each pulse will cause the + counter 36 to achieve a new count. When M pulses are counted, such as eight pulses, for example, the flip-flop 38 sets, which releases the strobe on the − comparator 35 and allows it to be triggered by negative pulses. As the receiver tuning continues to sweep, it will tune the signal through the IF center frequency, and negative pulses will appear at the output of discriminator 20. These pulses, via the negative comparator 35, now drive the - counter 37 until Q pulses, such as two pulses, are counted, at which time flip-flop 39 is set. The digital switch 40 is then activated from flip-flop 39, which connects up-down counter 44 to the + and − comparators and disconnects astable MV 42. Now, control of the up-down counter 44, and hence the tuning voltage, is purely a function of the state of the discriminator. Since the LO 16 is, at this point, detuned on the negative side of the discriminator, these negative pulses will count the up-down counter 44 down, and bring about a retuning of the signal.

Thereafter, if the input signal frequency changes due to drift or other causes, the discriminator output will go either + or − and cause the counter and tuning voltage to change to reduce such discriminator output to zero. Each RF pulse is evaluated and if it produces a discriminator output, the tuning voltage updated immediately, the time of response being limited only by propagation delays. Since the tuning voltage is determined by the state of a digital counter, there is virtually no drift associated with my novel circuit. This is to say, the Tuning Voltage on line 24 is varied incrementally only by counter 44 stepping up or down, so when no count occurs, the Tuning Voltage remains at a constant value.

Figure 3:
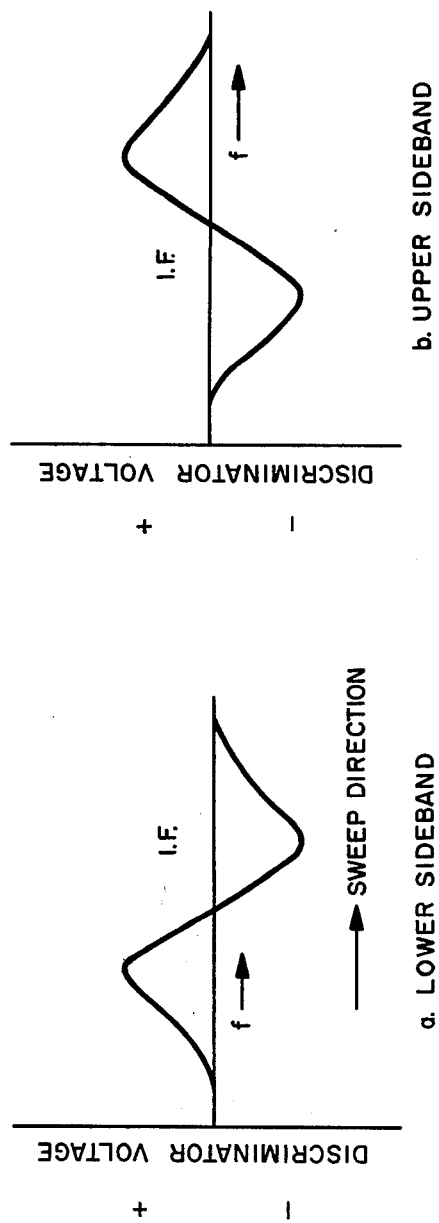
FIGS. 3a and 3b are waveforms showing respectively the envelope of the discriminator for the desired sideband, and for the image.

The manner in which my invention rejects the unwanted sideband (image) can best be understood by referring to FIGS. 3a and 3b. Although the discriminator can be constructed either way, it will be assumed, for purposes of explanation, that the lower sideband produces amplitudes for input frequencies below the IF and negative amplitudes for input frequencies above the IF and vice versa for the upper sideband. It is further assumed that the lower sideband is the desired frequency and the upper sideband the undesired image, although the circuit could of course be connected differently. FIG. 3a is therefore a representation of the voltage response of the discriminator 20 for the desired sideband, whereas FIG. 3b is the response for the image. Notice that in the case of the image, the first pulses encountered due to the sweeping LO 16 approaching the image are of opposite polarity from those of the desired sideband. Inspection of FIG. 2 might in the first instance lead to the conclusion that negative pulses would be received first. However, inasmuch as the - counter 35 cannot pass pulses until M positive pulses are received, the counter 37 will remain at zero count, digital switch 40 remains in the search mode position, and the LO 16 continues sweeping through the image, with no response by my AFC circuits.

Turning now to FIG. 4, it will there be seen that I have provided a schematic of a preferred embodiment of my invention, in which the signal from the discriminator is connected to the inputs of plus comparator 54 and minus comparator 55. The output from comparator 54 is connected to the input of plus counter 56, as well as to digital switch components, and the output from comparator 55 is connected to minus counter 57, as well as to digital switch components. The components 56 and 57 may make up two halves of a 4 bit counter 5493 made by Texas Instruments.

The outputs of inverters disposed at the outputs of the counters 56 and 57 are connected to flip-flops 58 and 59, which flip-flops may each be half of a Dual D component 5474. The outputs of these devices are connected to the strobe terminal of comparator 55, which may be one-half of an MC 1514 device made by Motorola, with the comparator 54 being the other half. Other outputs of the flip-flops are connected, for polarity reasons, to inverters, and thence to digital switch components 60a, 60b, and 60c.

The astable multivibrator is made up of components 62a and 62b, which respectively are a SE 566 T made by Signetics of Sunnyvale, California, and a 2N2222 transistor made by Texas Instruments. The output of 62b is connected to digital switch component 60c and latter in turn to component 60d.

The outputs of the digital switch components 60a through 60d connect directly or indirectly to the N-bit counter components 64a, 64b and 64c, these preferably being constituted by SN 54193 type 4 bit up-down counter units made by Texas Instruments. The outputs of the counter units in turn connect to N-bit D to A converter, which may take the form of a device 66a, further identified as DAC 100 made by Precision Monolithic, that is appropriately connected to an amplifier component 66b, which may be a component 101A made by National Semiconductor. The output of the latter is of course the Tuning Voltage, to be connected to the tunable local oscillator of the related receiver.

The signal from the Envelope Detector is of course connected to threshold detector 48, which may be a component 711 made by National Semiconductor. The output of latter device is connected to the signal presence retriggerable one-shot multivibrator 49, which may be a 54122 device made by Texas Instruments. The output from latter device is of course the signal on Clear Line 30 that is delivered via inverters to the counters 56 and 57, and to the flip-flops 58 and 59.

It is to be understood that the components identified in the foregoing description, and the voltages, interconnections and components represented on FIG. 4 are by way of illustration only, and I am not to be limited thereto.

I claim:

1. In a scanning type of superheterodyne radio receiver having a local oscillator, a mixer, and an intermediate frequency amplifier, a digital automatic frequency control circuit having a search mode and a lock mode for causing such receiver to automatically lock onto a received pulsed radio frequency signal falling within the scanning range of the receiver while rejecting the image frequency of such signal, said digital automatic frequency control circuit comprising:

a discriminator connected to the output of said intermediate frequency amplifier and having a center frequency equal to the intermediate frequency and providing a pulse output signal of one polarity and, after passing through zero, of the opposite polarity as the receiver scan approaches and then passes the received signal, pulse polarity sequence sensing means connected to the output of said discriminator actuated only by a predetermined polarity sequence of pulses from said discriminator for generating a control signal in response to a first polarity when followed by a certain number of pulses of a second polarity, a source of scanning pulses, switching means connected to receive and be operated by said control signal and having first and second functional positions, said switching means receiving as switched inputs said source of scanning pulses and pulses representing one polarity and the opposite polarity from said pulse polarity sequence sensing means, said switching means when in its first functional position providing as an output said scanning pulses and upon receiving said control signal and switching to its second functional position providing as an output said pulses from said pulse polarity sequence sensing means, up-down counter means connected to receive the pulse output of said switching means for counting in a first direction in response to said scanning pulses, in said first direction in response to pulses representing one polarity from said pulse polarity sequence sensing means, and in a second direction in response to pulses representing the opposite polarity from said pulse polarity sequence sensing means, and digital-to-analog converter means connected to said up-down counter means for generating an incrementally variable tuning voltage for said local oscillator proportional to the count stored in said up-down counter means.

2. A digital automatic frequency control circuit as recited in claim 1 wherein said pulse polarity sequence sensing means comprises:

first comparator means connected to receive the output of said discriminator for providing output pulses representing said one polarity, second comparator means connected to receive the output of said discriminator for providing output pulses representing said other polarity, first counter means connected to said first comparator means for counting pulses representing said one polarity, means responsive to a predetermined count in said first counter means and connected to said second comparator means for enabling said second comparator means to provide means to provide output pulses, second counter means connected to said second comparator means for counting pulses representing said other polarity, and means responsive to a predetermined count in said second counter means for generating said control signal.

3. A digital automatic frequency control circuit as recited in claim 2 further comprising means connected to the output of said intermediate frequency amplifier for generating a reset signal for said first and second counter means after a predetermined period of time following the last signal received by said receiver thereby reinstituting the search mode upon the occurrence of more than a momentary loss of the desired signal.

4. A digital automatic frequency control circuit as recited in claim 3 wherein said means for generating a reset signal comprises:

an envelope detector connected to the output of said intermediate frequency amplifier for producing a detected pulsed output when a signal appears within the passband of said intermediate frequency amplifier, a threshold detector connected to the output of said envelope detector and producing an output when said detected pulsed output exceeds a predetermined minimum threshold, and retriggerable one-shot means triggered by the output of said threshold detector for generating said reset signal said predetermined period of time after last being triggered.

* * * * *